United States Patent
Zhang et al.

(10) Patent No.: US 10,842,043 B1
(45) Date of Patent: Nov. 17, 2020

(54) FABRICATING COOLANT-COOLED HEAT SINKS WITH INTERNAL THERMALLY-CONDUCTIVE FINS

(71) Applicant: INTERNATIONAL BUSINESS MACHINES CORPORATION, Armonk, NY (US)

(72) Inventors: Hongqing Zhang, Hopewell Junction, NY (US); David J. Lewison, LaGrangeville, NY (US); Jay A. Bunt, Esopus, NY (US); Joyce Molinelli Acocella, Poughquag, NY (US); Jeffrey Allen Zitz, Poughkeepsie, NY (US); Frank L. Pompeo, Redding, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/679,496

(22) Filed: Nov. 11, 2019

(51) Int. Cl.
*H05K 7/20* (2006.01)
*F28D 1/053* (2006.01)
(Continued)

(52) U.S. Cl.
CPC ....... *H05K 7/20254* (2013.01); *F28D 1/0316* (2013.01); *F28D 1/05308* (2013.01);
(Continued)

(58) Field of Classification Search
CPC ...... F28D 1/0316; F28D 1/05308; F28F 3/06; F28F 2013/005; F28F 2013/006;
(Continued)

(56) References Cited

U.S. PATENT DOCUMENTS

| 4,137,369 A | 1/1979 | Chaikin |
| 4,416,408 A | 11/1983 | Spirig |

(Continued)

FOREIGN PATENT DOCUMENTS

| JP | 2006-041024 A | 9/2006 |
| WO | WO 2017/127447 A1 | 7/2017 |

OTHER PUBLICATIONS

Kang, SK et al., "Thermal Sponge", IBM Prior Art Database Technical Disclosure, IPCOM000039093D (Feb. 1, 2005) (3 pages).

*Primary Examiner* — Jacob R Crum
(74) *Attorney, Agent, or Firm* — Tihon Poltavets, Esq.; Kevin P. Radigan, Esq.; Heslin Rothenberg Farley & Mesiti P.C.

(57) ABSTRACT

Methods of producing coolant-cooled heat sinks with a coolant-carrying compartment between a cover and a heat transfer base are provided. The heat transfer base includes a heat transfer surface to couple to a component to be cooled, and a plurality of thermally-conductive fins extending into the coolant-carrying compartment from a surface of the heat transfer base opposite to the heat transfer surface. The method includes positioning a screen with openings over the plurality of thermally-conductive fins, between the plurality of thermally-conductive fins and the cover, and providing a joining material over the screen, between the screen and the cover. The method also includes joining the plurality of thermally-conductive fins to the cover across the screen using the joining material, where the screen facilitates retaining the joining material over the plurality of thermally-conductive fins during the joining.

20 Claims, 9 Drawing Sheets

(51) Int. Cl.
*F28D 1/03* (2006.01)
*F28F 3/06* (2006.01)
*F28F 13/00* (2006.01)

(52) U.S. Cl.
CPC ........... *F28F 3/06* (2013.01); *H05K 7/20418* (2013.01); *H05K 7/20509* (2013.01); *F28F 2013/005* (2013.01)

(58) Field of Classification Search
CPC ........... H05K 7/20254; H05K 7/20418; H05K 7/20427; H05K 7/20454; H05K 7/20472; H05K 7/20509
See application file for complete search history.

(56) References Cited

U.S. PATENT DOCUMENTS

| | | |
|---|---|---|
| 4,616,699 A | 10/1986 | Grote |
| 4,843,693 A | 7/1989 | Chisholm |
| 5,309,321 A | 5/1994 | Olla et al. |
| 5,558,155 A | 9/1996 | Ito |
| 6,085,833 A | 7/2000 | Kumura et al. |
| 6,637,109 B2 | 10/2003 | Nyqvist |
| 6,653,741 B2 | 11/2003 | Sreeram et al. |
| 7,124,809 B2 | 10/2006 | Rosenfeld et al. |
| 7,137,443 B2 | 11/2006 | Rosenfeld et al. |
| 7,361,978 B2 | 4/2008 | Stephens |
| 7,562,444 B2 | 7/2009 | Vetter |
| 9,439,325 B2 | 9/2016 | Campbell et al. |
| 9,504,184 B2 | 11/2016 | Krug, Jr. et al. |
| 2005/0155752 A1* | 7/2005 | Larson ................. H01L 23/3736 165/185 |
| 2006/0098411 A1* | 5/2006 | Lee ....................... F28D 15/046 361/704 |
| 2007/0141378 A1* | 6/2007 | Pacheco ............... H01L 23/3733 428/607 |
| 2008/0087456 A1 | 4/2008 | Schuette |
| 2008/0128122 A1* | 6/2008 | Huang .................. H01L 23/373 165/185 |
| 2008/0230208 A1* | 9/2008 | Rasmussen ........... H01L 23/473 165/80.4 |
| 2009/0109611 A1* | 4/2009 | Anderl ................. H01L 23/427 361/679.47 |
| 2009/0269521 A1 | 10/2009 | Tuma |
| 2010/0186938 A1* | 7/2010 | Murata .................... B23P 15/26 165/185 |
| 2011/0221076 A1* | 9/2011 | Takayama ............ H01L 23/142 257/786 |
| 2011/0272122 A1 | 11/2011 | Corbeil et al. |
| 2012/0074568 A1* | 3/2012 | Eichinger ........... H01L 21/4871 257/741 |
| 2015/0176915 A1* | 6/2015 | Krishnan ................ F28D 15/04 165/104.26 |
| 2016/0295748 A1* | 10/2016 | Desiano ............. H05K 7/20772 |
| 2017/0205160 A1* | 7/2017 | Yanagawa .......... B23K 35/0244 |

\* cited by examiner

FABRICATING COOLANT-COOLED HEAT SINKS WITH INTERNAL THERMALLY-CONDUCTIVE FINS

BACKGROUND

Operating electronic components produce heat, which needs to be removed in an effective manner in order to maintain device junction temperatures within desirable limits, with failure to do so resulting in excessive component temperatures, potentially leading to thermal runaway conditions. Several trends in the electronics industry combine to increase the importance of thermal management, including in technologies where thermal management has traditionally been less of a concern. In particular, the need for faster and more densely packed circuits has had a direct impact on the importance of thermal management. For instance, power dissipation, and therefore heat production, increases as device operating frequencies increase. Also, increased operating frequencies are possible at lower device junction temperatures. Further, as more and more components are packed onto a single chip, heat flux (Watts/cm$^2$) increases, resulting in the need to dissipate more power from a given sized chip, module, or system. These trends have combined to create applications where traditional air-cooling methods alone, such as methods using air-cooled heat sinks with heat pipes or vapor chambers, are unable to remove sufficient heat.

The need to cool current and future high-heat load, high-heat flux electronic components thus mandates the continued development of more aggressive thermal management techniques using, for instance, liquid-cooling. Various types of liquid coolants and liquid-cooling approaches are known, and provide different cooling capabilities. For instance, fluids such as refrigerants or other dielectric liquids (e.g., fluorocarbon liquids) exhibit lower thermal conductivity and specific heat properties, compared to liquids such as water or other aqueous fluids, but can be placed in direct physical contact with electronic components and their associated interconnects without adverse effects, such as corrosion or electrical short circuits. Other coolant liquids, such as water or other aqueous fluids, exhibit superior thermal conductivity and specific heat compared to dielectric fluids. However, water-based coolants must be separated from physical contact with the electronic components and interconnects, since corrosion and electrical short circuit problems are otherwise likely to result. This is typically accomplished by flowing the liquid coolant through a liquid-cooled heat sink or cold plate.

SUMMARY

Certain shortcomings of the prior art are overcome, and additional advantages are provided through the provision of a method of providing a coolant-cooled heat sink with a coolant-carrying compartment between a cover and a heat transfer base. The heat transfer base includes a heat transfer surface to couple to a component to be cooled, and the heat transfer base has a plurality of thermally-conductive fins extending into the coolant-carrying compartment from a surface of the heat transfer base opposite to the heat transfer surface. The method includes: positioning a screen with openings over the plurality of thermally-conductive fins, between the plurality of thermally-conductive fins and the cover; and providing a joining material over the screen, between the screen and the cover. The method also includes joining the plurality of thermally-conductive fins to the cover across the screen using the joining material. During the joining, the screen facilitates retaining the joining material over the plurality of thermally-conductive fins. Advantageously, with the screen facilitating retaining the joining material over the plurality of thermally-conductive fins during the joining process, migration of the joining material into gaps between the plurality of thermally-conductive fins is inhibited, or even prevented.

In one or more embodiments, the openings in the screen are sized to inhibit the joining material from moving into gaps between adjacent thermally-conductive fins of the plurality of thermally-conductive fins during the joining. Advantageously, by sizing the openings in the screen to inhibit the joining material from moving into the gaps between adjacent thermally-conductive fins during the joining process, the openings function as small reservoirs of a finite quantity of joining material, which reduces the total surface energy and inhibits the joining material from moving by capillary action into the gaps between fins during the joining process.

In one or more embodiments, the joining includes applying heat to melt the joining material, with the melted joining material wetting the screen, and migrating, at least in part, into the openings in the screen. Advantageously, wetting the screen with the melted joining material distributes the melted joining material, at least in part, across the screen, during the joining process, potentially increasing mechanical strength and rigidity of the resultant assembly. Further, the melted joining material migrating, at least in part, into the openings of the screen, reduces the total surface energy of the melted joining material over the plurality of thermally-conductive fins, thereby inhibiting the melted joining material from migrating into gaps between the thermally-conductive fins, and preventing the melted joining material from clogging the gaps between thermally-conductive fins.

In one or more embodiments, the screen is a metal screen, and the joining material is a brazing material. Advantageously, the same brazing facilities and materials as currently practiced in forming coolant-cooled heat sinks can be used, including the same braze furnace and alloys, without significant change. The addition of the screen, and the operation of the screen during the fabrication process, results in minimal to no impact to the brazing process, or profile, as currently practiced, including temperature, furnace atmosphere control, etc.

In one or more embodiments, the openings in the screen are similarly sized and configured, and a transverse cross-sectional size of the openings is substantially equal to or less than a gap spacing between adjacent thermally-conductive fins of the plurality of thermally-conductive fins extending from the surface of the heat transfer base. This opening size and configuration advantageously inhibits the joining material from moving by capillary action into, for instance, the similarly-sized gap spacing of the thermally-conductive fins, as explained herein.

In one or more implementations, the screen includes a plate with the openings being sized to inhibit the joining material from moving into gaps between adjacent thermally-conductive fins of the plurality of thermally-conductive fins during the joining. Further, in one or more other embodiments, the screen includes a mesh structure with the openings being sized to inhibit the joining material from moving into gaps between adjacent thermally-conductive fins of the plurality of thermally-conductive fins during the joining process. In one or more embodiments, the screen is flat and sized and configured to overlie a footprint of the plurality of thermally-conductive fins within the coolant-carrying compartment of the coolant-cooled heat sink.

In another aspect, an apparatus is provided which includes a coolant-cooled heat sink with a coolant-carrying compartment. The coolant-cooled heat sink includes a heat transfer base with a heat transfer surface to couple to a component to be cooled. The heat transfer base further includes a plurality of thermally-conductive fins extending into the coolant-carrying compartment from a surface of the heat transfer base opposite to the heat transfer surface. A cover is sealed to the heat transfer base, and the heat transfer base and cover define, at least in part, the coolant-carrying compartment therebetween. A screen with openings is disposed over the plurality of thermally-conductive fins of the heat transfer base, between the plurality of thermally-conductive fins and the cover, and a joining material is disposed between the screen and the cover, and within, at least in part, the openings in the screen. The joining material joins the plurality of thermally-conductive fins of the heat transfer base to the cover across the screen. Advantageously, the screen facilitates retaining the joining material in position over the plurality of thermally-conductive fins during fabrication of the coolant-cooled heat sink, inhibiting the joining material from clogging gaps between adjacent thermally-conductive fins of the plurality of thermally-conductive fins.

In a further aspect, an apparatus is provided which includes a heat-generating electronic component, and a coolant-cooled heat sink. The coolant-cooled heat sink includes a heat transfer base with a heat transfer surface coupled to the heat-generating electronic component. The heat transfer base includes a plurality of thermally-conductive fins extending into a coolant-carrying compartment of the coolant-cooled heat sink from a surface of the heat transfer base opposite to the heat transfer surface. A cover is sealed to the heat transfer base, and the heat transfer base and cover define, at least in part, the coolant-carrying compartment therebetween. A screen with openings is disposed over the plurality of thermally-conductive fins of the heat transfer base, between the plurality of thermally-conductive fins and the cover. A joining material is disposed between the screen and the cover, and within, at least in part, the openings in the screen. The joining material joins the plurality of thermally-conductive fins of the heat transfer base to the cover across the screen. Advantageously, the screen facilitates retaining the joining material in position over the plurality of thermally-conductive fins during fabrication of the coolant-cooled heat sink, inhibiting the joining material from clogging gaps between adjacent thermally-conductive fins of the plurality of thermally-conductive fins.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages and details thereof, are explained more fully below with reference to the non-limiting example(s) illustrated in the accompanying drawings. Descriptions of well-known materials, systems, devices, fabricating techniques, processes, etc., are omitted so as to not unnecessarily obscure the invention in detail. It should be understood, however, that the detailed description in this specific example(s), while indicating aspects of the invention, is given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of a coolant-cooled heat sink with internal thermally-conductive fins, as disclosed herein.

As is known, an electronics rack, or IT rack, includes any housing, frame, rack, compartment, blade server system, etc., having one or more heat-generating components of a computer system, electronic system, information technology equipment, etc. In one or more embodiments, an electronics rack can include a portion of an electronic system, a single electronic system, or multiple electronic systems, for instance, in one or more sub-housings, blades, books, drawers, nodes, compartments, etc., each having one or more heat-generating electronic components disposed therein. An electronic system within an electronics rack can be movable or fixed relative to the electronics rack, with rack-mounted electronic drawers being an example of systems of an electronics rack to be cooled.

An electronic component refers to any heat-generating electronics component of, for instance, a computer system or other electronics unit requiring cooling. By way of example, an electronic component can include one or more integrated circuit die (or chips), and/or other electronic devices to be cooled, including one or more processor chips, such as central processing unit (CPU) chips and/or graphics processing unit (GPU) devices. Further, the term coolant-cooled heat sink or cold plate refers to a thermally-conductive structure or assembly having one or more internal compartments, channels, passageways, etc., formed therein for flowing of coolant therethrough.

One example of coolant to be used within a coolant-cooled heat sink discussed herein is water. However, the cooling concepts disclosed herein are readily adapted to use with other types of coolant.

As noted, due to the ever-increasing airflow requirements through electronics racks of a data center, and the limits of air distribution within a typical data center installation, it can be desirable for liquid-based cooling to, for instance, be combined with, or used in place of, conventional air-cooling. By way of example only, FIGS. 1-3 illustrate one embodiment of a data center and electronics system employing a liquid-based cooling system or cooling assembly with one or more coolant-cooled heat sinks or cold plates coupled to high-heat-generating electronic components disposed within one or more electronic systems of one or more electronics racks.

Figure 1:
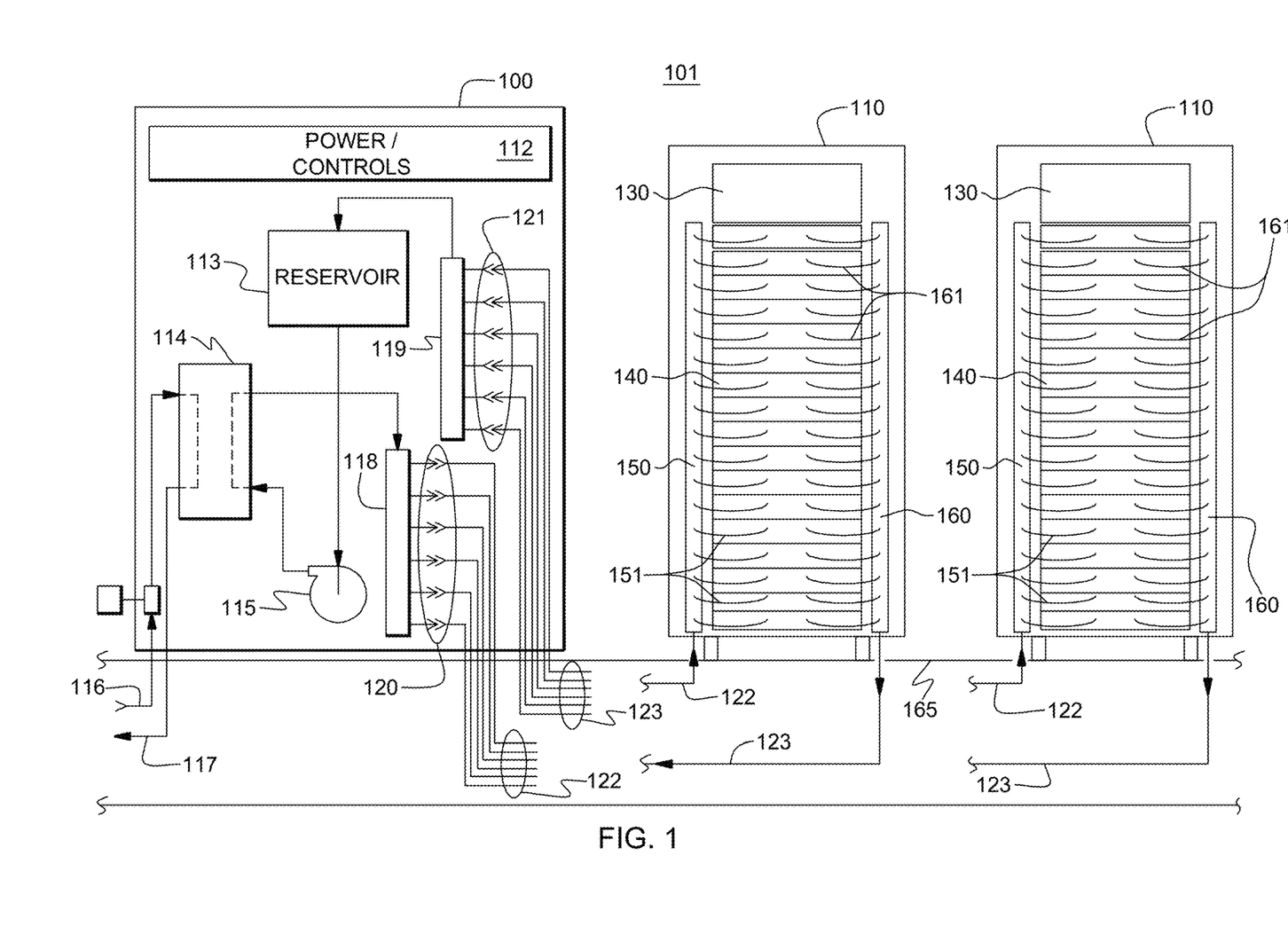
FIG. 1 depicts one embodiment of a coolant-cooled data center with a coolant distribution unit facilitating liquid-cooling of electronic systems within racks of the data center, in accordance with one or more aspects of the present invention.

In particular, FIG. 1 depicts one embodiment of a data center 101 including a coolant distribution unit 100. The coolant distribution unit can be a relatively large unit which occupies what would be considered a full electronics frame. Within coolant distribution unit 100 is a power/control element 112, a reservoir/expansion tank 113, a heat exchanger 114, a pump 115 (possibly accompanied by a redundant second pump), facility water inlet 116 and outlet 117 supply pipes, a supply manifold 118 supplying water or system coolant to the electronics racks 110 via couplings 120 and lines 122, and a return manifold 119 receiving water from the electronics racks 110, via lines 123 and couplings 121. Each electronics rack includes (in one example) a power/control unit 130 for the electronics rack, multiple electronic systems 140, a system coolant supply manifold 150, and a system coolant return manifold 160. By way of example only, electronics rack 110 are disposed on a raised floor 165 of data center 101, with lines 122 providing system coolant to system coolant supply manifolds 150 and lines 123 facilitating return of system coolant from system coolant return manifolds 160 being disposed beneath the raised floor.

In one embodiment, system coolant supply manifold 150 provides system coolant to the cooling assemblies of the electronic systems (including to coolant-cooled heat sinks thereof) via flexible hose connections 151, which are disposed between the supply manifold and the respective electronic systems within the rack. Similarly, system coolant return manifold 160 is coupled to the electronic systems via flexible hose connections 161. Quick connect couplings can be employed at the interface between flexible hoses 151, 161 and the individual electronic systems.

Figure 2A:
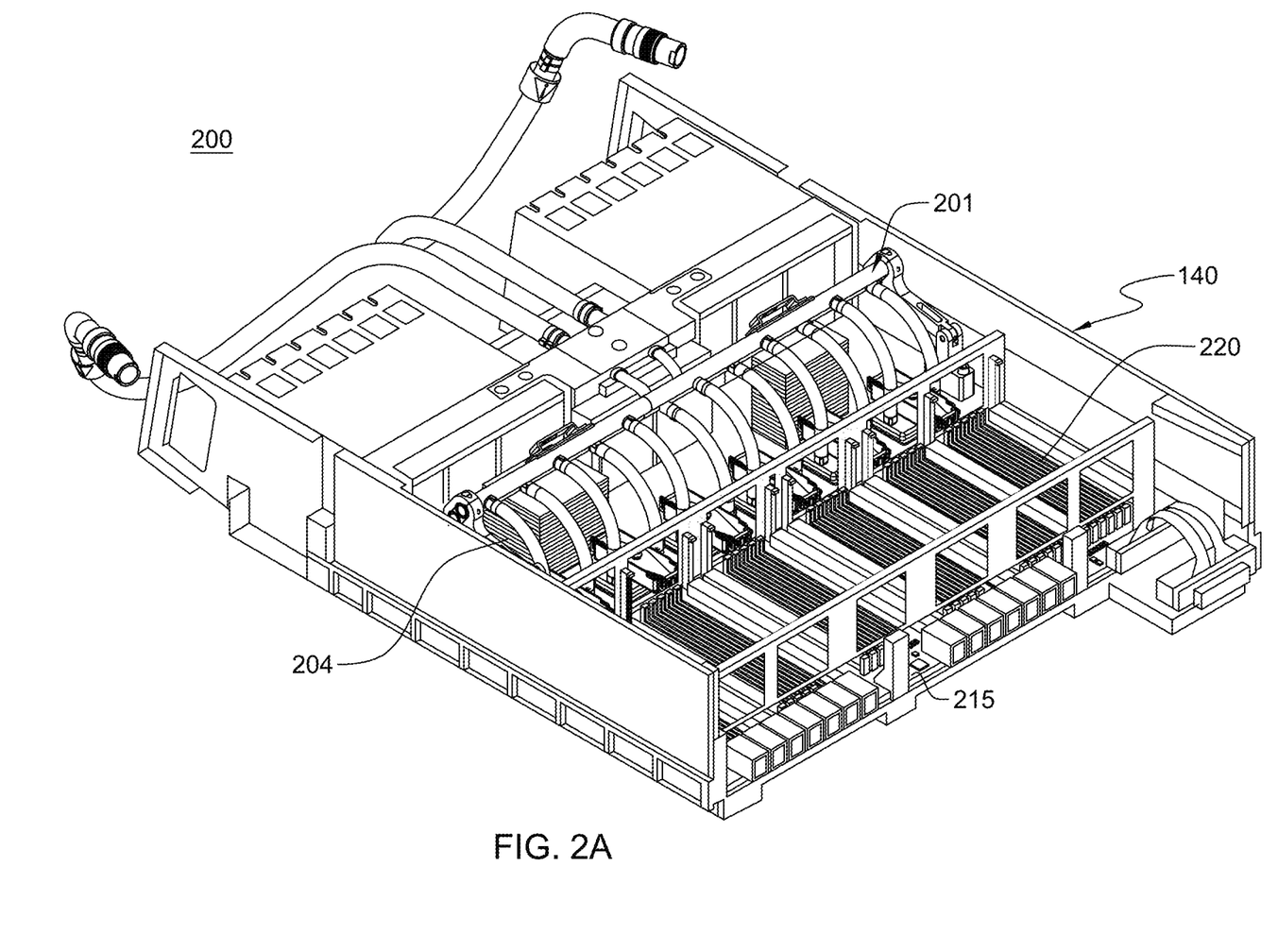
FIG. 2A depicts one embodiment of a partially assembled electronic system and cooling assembly layout, wherein the electronic system includes, by way of example, six heat-generating electronic components to be actively cooled by the cooling assembly, in accordance with one or more aspects of the present invention.
Figure 2B:
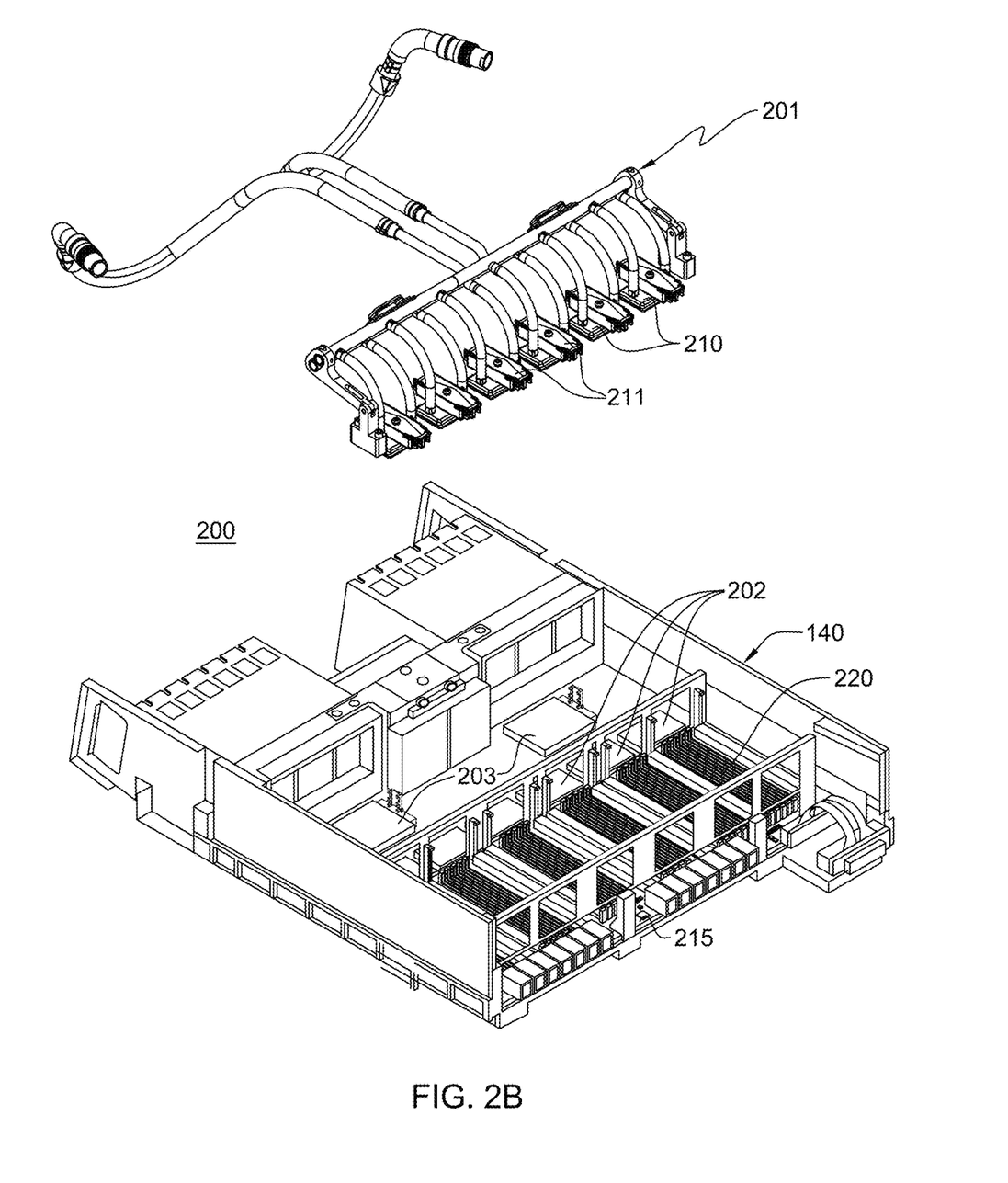
FIG. 2B depicts the electronic system and cooling assembly layout of FIG. 2A, with the cooling assembly shown exploded from the electronic system, in accordance with one or more aspects of the present invention.
Figure 3:
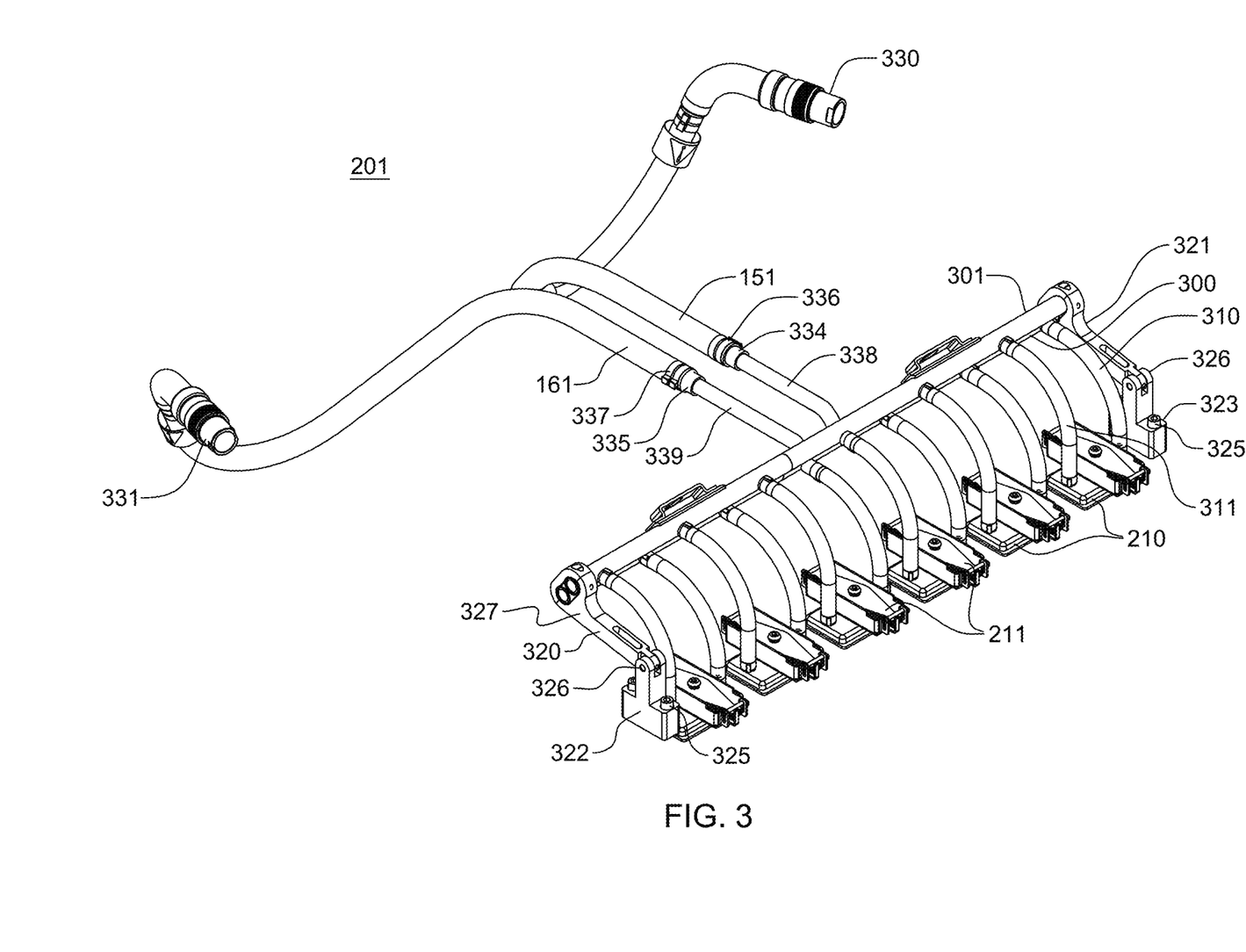
FIG. 3 is an enlarged view of the cooling assembly of FIGS. 2A & 2B, in accordance with one or more aspects of the present invention.

FIGS. 2A & 2B depict one embodiment of a cooled electronic system 200, in accordance with one or more aspects of the present invention. By way of example, cooled electronic system 200 includes electronic system 140, such as the above-described drawer- or node-level electronic system of FIG. 1, and a flexible coolant manifold-heat sink assembly 201 coupled thereto, in accordance with one or more aspects of the present invention. In this implementation, flexible coolant manifold-heat sink assembly 201 is a drawer- or node-level cooling assembly with multiple coolant-cooled heat sinks 210, each configured and sized to attach to and cool a respective electronic component 202, such as a respective high-heat-generating electronic component of a server node. In one example, respective loading brackets 211 can be provided to facilitate secure attachment and loading of coolant-cooled heat sinks 210 to electronic components 202 to ensure good thermal conduction from electronic components 202 to coolant-cooled heat sinks 210.

As one detailed example, the exemplary electronic system of FIGS. 2A & 2B can be an electronics drawer or planar server assembly, which includes a multilayer printed circuit board to which memory sockets and various electronic components to be cooled are attached, both physically and electrically. As illustrated, electronic system 140 can include a support substrate or planar board 215, a plurality of memory module sockets 220 (e.g., dual in-line memory module sockets), as well as high-heat-generating processor modules 202, and other components 203, such as memory support modules, which produce less heat and can be air-cooled.

By way of example only, in one or more implementations, one or more other components 203 of electronic system 140 can be air-cooled by an airflow established using one or more air-moving devices (not shown) within electronic system 140, or the electronics rack housing the system. As illustrated, the one or more other components 203 to be air-cooled may have one or more air-cooled heat sinks 204 (FIG. 2A) physically coupled thereto. Note that in the particular embodiment depicted, flexible coolant manifold-heat sink assembly 201 includes a pivotable coolant supply manifold and pivotable coolant return manifold disposed in a first, operational position in FIG. 2A, laterally offset from the row of coolant-cooled heat sinks 210, but overlying the one or more other components 203 of electronic system 140, such as one or more single-chip modules to which air-cooled heat sinks 204 are coupled.

FIG. 3 depicts an enlarged view of one embodiment of flexible coolant manifold-heat sink assembly 201. Note that this implementation of cooling assembly 201 is a drawer- or node-level implementation designed to reside within an electronic system chassis of, for instance, one or more electronic system chassis within an electronics rack, and is discussed herein by way of example only. As illustrated, in addition to multiple coolant-cooled heat sinks 210, flexible coolant manifold-heat sink assembly 201 includes a pivotable coolant supply manifold 300 and a pivotable coolant return manifold 301, which are coupled in this embodiment at opposite ends to a first pivot arm 320 and a second pivot arm 321. Flexible coolant supply conduits 310 and flexible coolant return conduits 311 couple, in the illustrated example, each coolant-cooled heat sink 210 in fluid communication with pivotable coolant supply manifold 300 and pivotable coolant return manifold 301 to allow for flow of coolant, such as liquid coolant, through the heat sinks to facilitate extraction of heat generated by the associated electronic components to which the heat sinks are coupled. Note that, by way of example, each coolant-cooled heat sink 210 has a flexible coolant supply conduit 310 and a flexible coolant return conduit 311 coupled thereto for direct supply and return of coolant through the coolant-cooled heat sink. Thus, in the illustrated embodiment, coolant, such as liquid coolant, flows in parallel through the heat sinks between the pivotable coolant supply manifold 300 and pivotable coolant return manifold 301.

As noted, respective loading brackets 211 can be provided to facilitate (in part) a good thermal interface and good thermal conduction between coolant-cooled heat sinks 210 and the associated electronic components 202 (FIG. 2B) to be cooled. Flexible coolant supply conduits 310 and flexible coolant return conduits 311 are, in one embodiment, fabricated of a flexible, insulative material, such as rubber, and are of sufficient length to couple rigid coolant-cooled heat sinks 210 to pivotable coolant supply manifold 300 and pivotable coolant return manifold 301, via appropriate hose barb fittings and hose clamps. Note that the length of each coolant supply conduit 310 and coolant return conduit 311 is also sufficient to allow for pivotable movement of the rigid pivotable coolant supply manifold 300 and rigid pivotable coolant return manifold 301 between a first position, illustrated in FIG. 3, and a second service position, not illustrated. Note in this regard that the first and second pivot arms 320, 321 include respective base members for 322, 323 which facilitate fastening of the first and second pivot arms to, for instance, a structure associated with the electronic system including the electronic components to be cooled. For instance, the first and second pivot arms 320, 321 could be affixed using mechanical fasteners 325 to the support substrate or planar system board in the example of FIGS. 2A & 2B. Note also, in the example depicted in FIG. 3, first and second pivot arms 320, 321 align with the row of coolant-cooled heat sinks 210, and include a pivot axis 326 at upper ends of base members 322, 323, about which pivot elements 327 of the first and second pivot arms 320, 321, pivot. In the example depicted, the pivot axis 326 is at an elevated height above the row of coolant-cooled heat sinks 210, and pivotable coolant supply manifold 300 and pivotable coolant return manifold 301 are at an elevation higher than the coolant-cooled heat sinks when installed within the associated electronic system.

Flexibility is further achieved in the cooling assembly disclosed using flexible manifold-to-node fluid connect hoses 151, 161 to connect flexible coolant manifold-heat sink assembly 201 to, for instance, rack-level coolant supply and return manifolds, respectively (see FIGS. 1-2B). In one or more implementations, respective quick connect couplings 330, 331 at the ends of flexible manifold-to-node fluid connect hoses 151, 161, can be provided, and rigid tube extensions 338, 339 can respectively extend from pivotable coolant supply manifold 300 and pivotable coolant return manifold 301 and facilitate coupling of flexible manifold-to-node fluid connect hoses 151, 161 to the corresponding pivotable coolant supply and return manifolds using, for instance, respective hose barb fittings 334, 335 and hose clamps 336, 337. Note that, in one implementation, pivoting of pivotable coolant supply and return manifolds 300, 301 can be facilitated by providing flexible manifold-to-node fluid connect hoses 151,161 with sufficient length to allow for transition of the pivotable coolant supply and return manifolds 300, 301 between their respective first and second positions, as described. Alternatively, the respective quick connect couplings 330, 331 with poppets can be disengaged from, for instance, the rack-level coolant supply and return manifolds (FIG. 1) prior to pivoting of the pivotable coolant supply and return manifolds 300, 301 from the illustrated first position to their second position.

By way of example, and as illustrated in FIGS. 2A & 3, pivotable coolant supply and return manifolds 300, 301 can be in a first position to, for instance, facilitate inclusion of the cooling assembly within the electronic system housing, drawer, chassis, etc., and operational insertion of the resultant cooled electronic system within the respective electronics rack. From this position, flexible coolant supply and return conduits 310, 311, and (in one or more embodiments) flexible manifold-to-node fluid connect hoses 151, 161 allow for pivoting of pivotable coolant supply and return manifolds 300, 301 to a second position, such as for servicing. Note that the in-line, six electronic component and six coolant-cooled heat sink example of FIGS. 2A-3 is provided as one example only of a coolant-based cooling system with coolant-cooled heat sinks, such as disclosed herein. In general, the coolant-cooled heat sinks disclosed herein can be used in a wide variety of coolant-based cooling systems to facilitate active cooling of one or more heat-generating components, such as one or more heat-generating electronic components of an electronic system, such as described above in connection with FIGS. 1-3, by way of example only.

In one or more embodiments, the coolant-cooled heat sink(s) of a cooling system can be partially or completely formed of a thermally-conductive metal material, such as copper or a copper alloy. Further, in one or more implementations, high-heat flux removal is facilitated by forming an array of thermally-conductive fins, such as an array of finely spaced, copper fins, extending interior to a coolant-carrying compartment of a closed coolant loop heat sink structure. In one embodiment, high-temperature brazing processes can be used to form hermetic (coolant-tight) seals between the cover plate, thermally-conductive fins, heat transfer base plate and hose barb connections. As fin pitch decreases, control of brazed flow material over the fins is advantageous in order to maximize efficiency of the cooling fin structure of the heat sink. For instance, as fin pitch decreases, strong capillary forces can cause liquid (e.g., melted) joining material to migrate into gap spaces between adjacent thermally-conductive fins, blocking, at least in part, the gaps, reducing coolant flow rate through the heat sink, and degrading thermal performance of the heat sink. Thus, enhanced control of the joining material over the fins during fabrication of the coolant-cooled heat sink is disclosed herein to advantageously maximize thermal performance of the heat sink in use.

Disclosed herein, in one or more embodiments, is the inclusion of a screen over the thermally-conductive fins with screen openings sized to create small reservoirs to trap excess joining material during the joining process. Also, in one or more embodiments, the screen material and extra surfaces introduced by the screen are selected/designed to wet/react with the joining materials (e.g., braze materials)

after the materials melt as part of the joining process. The bonding of the joining material to the screen, and flow of the material into the openings in the screen, advantageously reduces the total surface energy of the joining material, and inhibits or even prevents joining material from migrating into the underlying gaps between adjacent thermally-conductive fins. Advantageously, adding a screen, such as disclosed herein, over the thermally-conductive fins also facilitates increasing mechanical rigidity of the coolant-cooled heat sink by, for instance, dispersing the melted joining material more evenly across the interface between the thermally-conductive fins and cover. In one or more embodiments, the screen operates as a wicking element to direct the joining material laterally above the thermally-conductive fins, further mitigating or eliminating fin clogging during the joining process, which is particularly advantageous as pitch between thermally-conductive fins continues to decrease. The structural support provided by the screen and joining material also increases strength of the fin structures, and prevents fin bending and/or buckling by distributing forces across the top of the thermally-conductive fins during the joining process.

In general, disclosed herein are methods of fabricating coolant-cooled heat sinks with an internal coolant-carrying compartment between a cover and a heat transfer base. The heat transfer base includes a heat transfer surface to couple to a component to be cooled, and a plurality of thermally-conductive fins extending into the coolant-carrying compartment from the surface of the heat transfer base opposite to the heat transfer surface. Fabricating the coolant-cooled heat sink includes positioning a screen with openings over the plurality of thermally-conductive fins, between the plurality of thermally conductive fins of the heat transfer base and the cover, and providing a joining material over the screen, between the screen and the cover. The fabricating process further includes joining the plurality of thermally-conductive fins to the cover across the screen using the joining material, where the screen facilitates retaining the joining material over the plurality of thermally-conductive fins during the joining, including trapping excess joining material (e.g., braze material) during the joining process.

In one or more embodiments, the openings in the screen are sized to inhibit the joining material from moving into gaps between the adjacent thermally-conductive fins of the plurality of thermally-conductive fins during the joining process. In one or more implementations, the joining includes applying heat to melt the joining material, with the melted joining material wetting the screen, and migrating, at least in part, into the openings of the screen. In one embodiment, the screen is a metal screen, and the joining material is a brazing material.

In one or more embodiments, the openings in the screen are similarly-sized and configured, and a transverse cross-sectional size of the openings is substantially equal to or less than a gap space between adjacent thermally-conductive fins of the plurality of thermally-conductive fins.

In one or more embodiments, the screen includes a plate with the openings being sized to inhibit the joining material from moving into gaps between adjacent thermally-conductive fins of the plurality of thermally-conductive fins during the joining. In one or more other embodiments, the screen includes a mesh structure with the openings being sized to inhibit the joining material from moving into gaps between adjacent thermally-conductive fins of the plurality of thermally-conductive fins during the joining.

In one or more implementations, the screen is flat and sized and configured to substantially match a footprint of the plurality of thermally-conductive fins within the coolant-carrying compartment.

In one or more other aspects, an apparatus is provided which includes a coolant-cooled heat sink with a coolant-carrying compartment. The coolant-cooled heat sink includes a thermally-conductive base, a cover, a screen, and joining material. The thermally-conductive base includes a main heat transfer surface configured to couple to one or more components to be cooled, such as one or more electronic components. The heat transfer base further includes a plurality of thermally-conductive fins extending into the coolant-carrying compartment from a surface of the heat transfer base opposite to the heat transfer surface. The cover is sealed to the heat transfer base, and together the heat transfer base and cover define, at least in part, the coolant-carrying compartment. The screen includes openings, and is disposed over the plurality of thermally-conductive fins of the heat sink base, between the plurality of thermally-conductive fins and the cover. The joining material is disposed between the screen and the cover, and within, at least in part, the openings of the screen, so that the joining material joins the plurality of thermally-conductive fins to the cover across the screen. In one or more embodiments, a coolant inlet and coolant outlet are in fluid communication with the coolant-carrying compartment to facilitate coolant flow through the compartment.

In one or more embodiments, the openings in the screen are sized to inhibit the joining material when melted from migrating into gaps between adjacent thermally-conductive fins of the plurality of thermally-conductive fins. Further, the screen is formed of a material selected to wet with melting of the joining material during a joining or sealing process to join the plurality of thermally-conductive fins and cover.

In one or more embodiments, a transverse cross-sectional size of the openings extending through the screen is substantially equal to or less than the gap spacing (or pitch) between adjacent thermally-conductive fins of the plurality of thermally-conductive fins.

By way of example, the plurality of thermally-conductive fins within the heat sink can include a plurality of parallel-disposed thermally-conductive plate fins, which define channels between the fins, into which coolant is introduced and flows, for example, from an inlet side of the coolant-cooled heat sink to an outlet side of the coolant-cooled heat sink, in a direction substantially parallel to the main heat transfer surface of the heat transfer base. Those skilled in the art should note, however, that the concepts disclosed herein can be used in association with differently configured thermally-conductive fins extending into the coolant-carrying channel from the heat transfer base. For instance, in one or more other embodiments, the thermally conductive fins can include a plurality of thermally-conductive pin fins extending into the coolant-carrying compartment from the surface of the heat transfer base opposite to the heat transfer surface.

By way of further example, FIGS. 4A-4D depict one embodiment of an apparatus 400, in accordance with one or more aspects of the present invention. As illustrated, in this embodiment, apparatus 400 includes one or more electronic components 401 (FIG. 4A) and a coolant-cooled heat sink 410 (shown in exploded view in FIG. 4A). The one or more electronic components 401 can be disposed, for instance, on a supporting substrate 402, which can facilitate electrical connection of the electronic component(s) to other component(s) of an electronic system, such as described above.

Figure 4A:
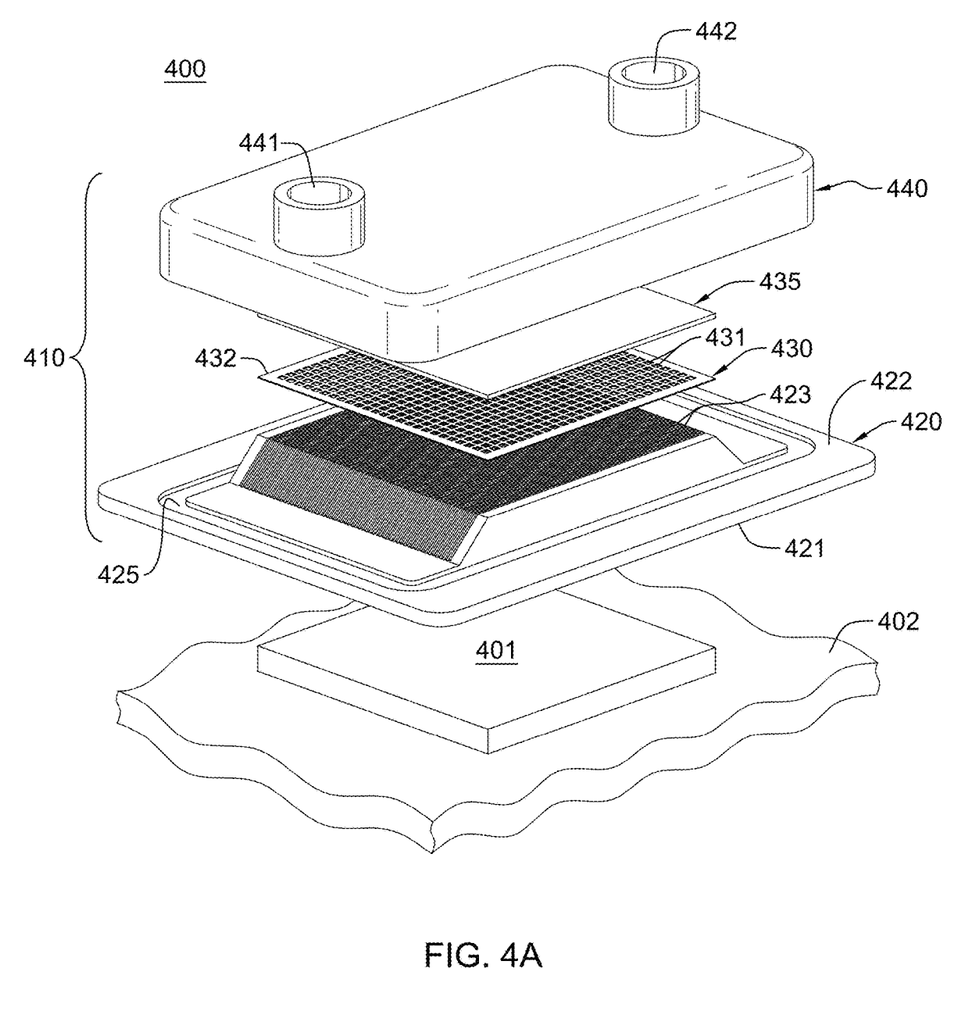
FIG. 4A depicts an exploded view of one embodiment an apparatus including one or more electronic components to be cooled, and a coolant-cooled heat sink for a cooling assembly, such as (for instance) the cooling assembly embodiment of FIGS. 1-3, in accordance with one or more aspects of the present invention.

Referring to FIG. 4A, coolant-cooled heat sink 410 includes, for instance, a thermal transfer base 420, a screen 430, a joining material 435, and a cover 440. In the depicted embodiment, heat transfer base 420, which is an active cooling portion, or heat transfer portion, of the coolant-cooled heat sink, is rectangular-shaped, by way of example only. In one or more embodiments, heat transfer base 420 is thermally-conductive, being fabricated of a good thermal conductor, such as a metal, for instance, copper or a metal alloy, such as a copper alloy. Heat transfer base 420 includes a heat transfer surface 421, sized and configured to couple to electronic component(s) 401 to be cooled. By way of example, heat transfer surface 421 can be a flat, lower surface of heat transfer base 420, which is appropriately sized to couple and substantially cover the electronic component(s) to be cooled. A plurality of thermally-conductive fins 423 extend, in one or more embodiments, from a surface 422 of heat transfer base 420 opposite to heat transfer surface 421. In the depicted embodiment, the plurality of thermally-conductive fins 423 are a plurality of thermally-conductive plate fins oriented substantially parallel, with channels defined between adjacent thermally-conductive plate fins. Note that the concepts disclosed herein can be used in association with other thermally-conductive fin configurations, as well.

In the embodiment depicted, screen 430 is sized to substantially overlie a footprint of thermally-conductive fins 423, and includes openings 431 extending therethrough. Screen 430 is disposed over the plurality of thermally-conductive fins of heat transfer base 420, between the plurality of thermally-conductive fins 423 and cover 440. The joining material 435, such as a braze or solder material, is similarly sized to overlie the footprint of the plurality of thermally-conductive fins 423, and is disposed between screen 430 and cover 440. Note that joining material 435 and/or joining material 435' (of FIGS. 4B-4D) refers to any material to facilitate joining, and/or a joint formed between, screen 430 and cover 440, such as during brazing, soldering, metal-metal diffusion bonding, resistance welding (RF), laser sealing and/or welding, etc. Note also that in one or more other embodiments, multiple smaller co-planar sheets of joining material 435 could be disposed between screen 430 and cover 440. During fabrication, a same or different joining material (e.g., braze material) can also be provided within a circumferential groove 425 formed in surface 422, sized and configured to receive an edge of cover 440 to facilitate hermetically sealing cover 440 to heat transfer base 420. In one or more embodiments, screen 430 can be fabricated of a metal or, for instance, a ceramic, with a higher melting point than the joining material 435.

Figure 4B:
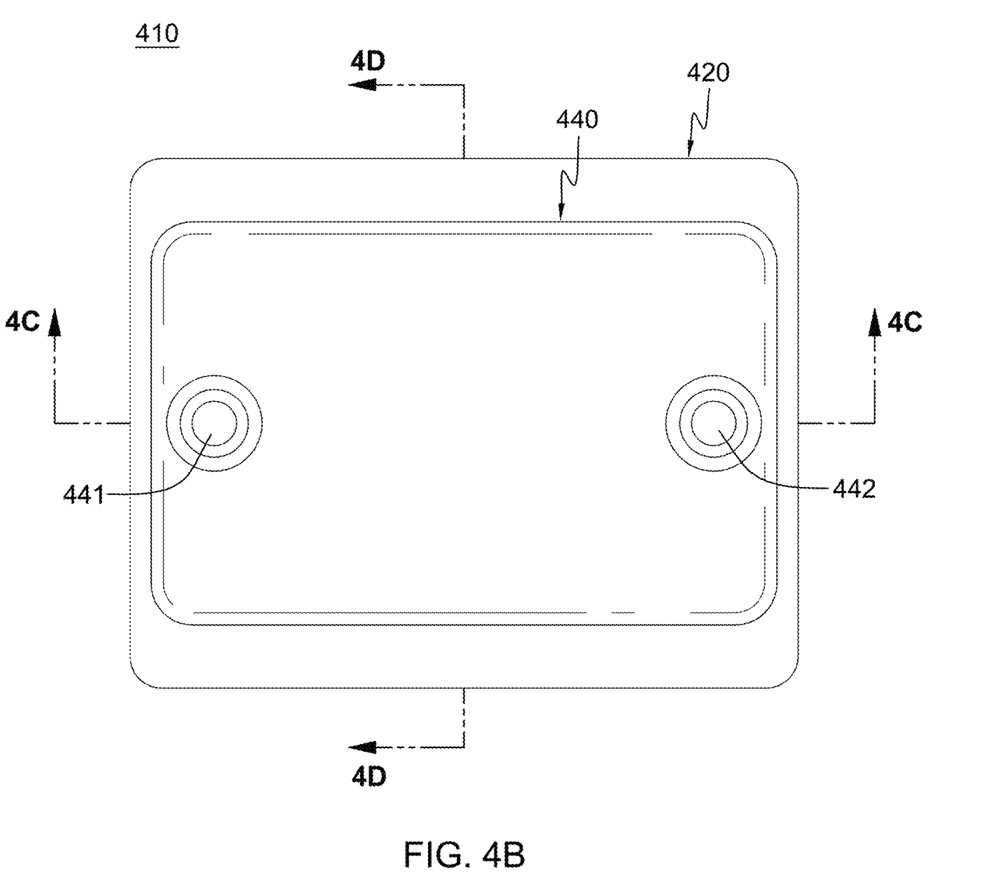
FIG. 4B is a plan view of the coolant-cooled heat sink of FIG. 4A, in accordance with one or more aspects of the present invention.
Figure 4C:
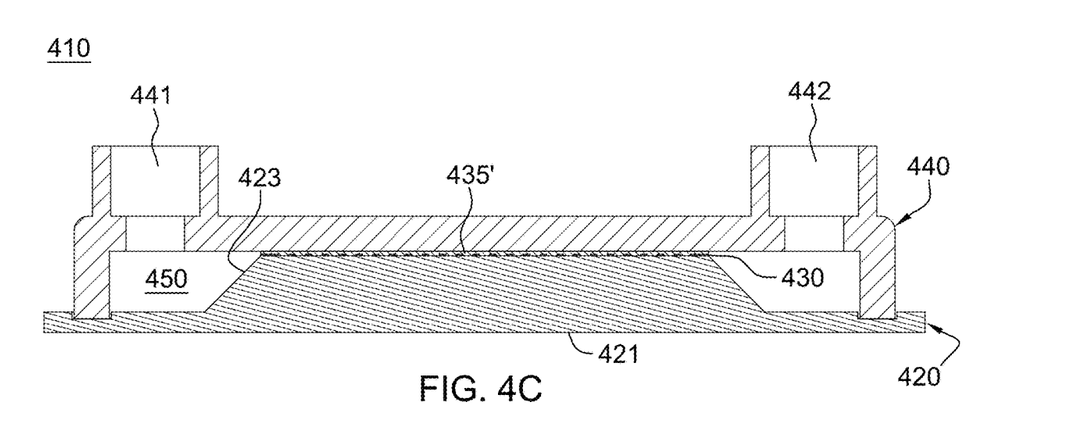
FIG. 4C is a cross-sectional elevational view of the coolant-cooled heat sink of FIG. 4B, taken along line 4C-4C thereof, in accordance with one or more aspects of the present invention.
Figure 4D:
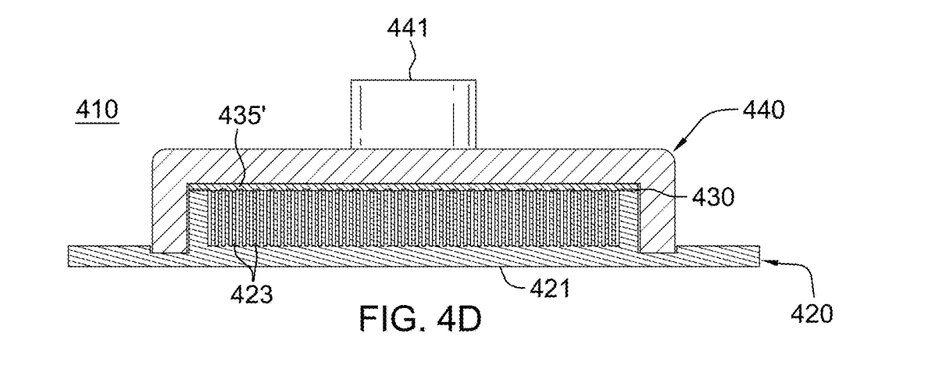
FIG. 4D is a cross-sectional elevational view of the coolant-cooled heat sink of FIG. 4B, taken along line 4D-4D thereof, in accordance with one or more aspects of the present invention.

FIGS. 4B-4D depict coolant-cooled cold plate 410 after assembly and sealing of cover 440 to heat transfer base 420. Referring collectively to FIGS. 4B-4D, cover 440 and heat transfer base 420 are configured to define an internal coolant-carrying compartment 450 between the cover and base with sealing of the cover to the base using, for instance, a joining material, as described herein. In one or more embodiments, as part of the sealing process, the coolant-cooled heat sink assembly is heated in order to melt the joining material(s), including the joining material disposed between screen 430 and cover 440, above thermally-conductive fins 423 of heat transfer base 420. By way of specific example, the joining material can be an industrial braze alloy, such as BCuP-5, and the sealing process can include placing the assembly with the braze material between screen 430 and cover 440 in a belt furnace, and raising the temperature of the assembly within the belt furnace from, for instance, starting room temperature to at or above the melting temperature of the braze alloy. For instance, BCuP-5 has a melting temperature of approximately 800° C., and so, the belt furnace can raise the temperature of the assembly to, for instance, 805° C. or 810° C. peak for a few seconds, after which the furnace is shut down and the assembly is allowed to cool. In one implementation, raising the temperature to 805°-810° C. might require 25-30 minutes, and cooling time may be, for instance, 45-60 minutes.

The sealing process results in the melted, and then cooled, joining material 435' joining the thermally-conductive fins 423 to cover 440 across screen 430 in order to, in part, provide a fluid-tight seal of thermally-conductive fins 423 to cover 440, thereby ensuring that coolant flowing through coolant-cooled heat sink 410 between a coolant inlet 441 and a coolant outlet 442 passes through the gaps between the thermally-conductive fins 423, and not over the fins. The migrated joining material 435' in the openings in screen 430 results from the melting of the joining material sheet noted above in connection with FIG. 4A. In one or more embodiments, screen 430 is formed of a material that allows the screen to wet with the melting of the joining material, creating small reservoirs of material within the openings of the screen. This wetting or reacting of the melting joining material and screen advantageously inhibits, or even prevents, the joining material from being drawn by capillary action, or otherwise flowing into gaps between the thermally-conductive fins 423 underlying screen 430. In one or more implementations, joining material 435' extends into at least a subset of the openings in screen 430. As noted, screen 430 is formed of a material that allows the screen to operate as a wetting or wicking element with melting of the joining material (e.g., brazing material) in order to distribute the joining material across the openings in screen 430, creating small reservoirs of joining material within the openings, thereby reducing the total surface energy, and preventing the joining material from migrating into the gaps between the fins. This wicking or wetting aspect also facilitates distributing the joining material across the screen, resulting in a more uniform joining of the top edges of the thermally-conductive fins to the cover. Once cooled, the resultant coolant-cooled structure of FIGS. 4C & 4D is obtained, with the melted and cooled joining material 435' forming a bond or joint between thermally-conductive fins 423 and cover 440 across screen 430.

Figure 5A:
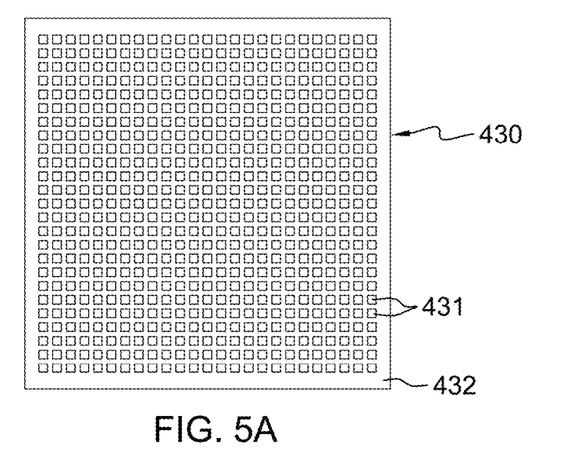
FIG. 5A is a plan view of one embodiment of a screen for a coolant-cooled heat sink, such as the coolant-cooled heat sink of FIGS. 4A-4D, in accordance with one or more aspects of the present invention.
Figure 5B:
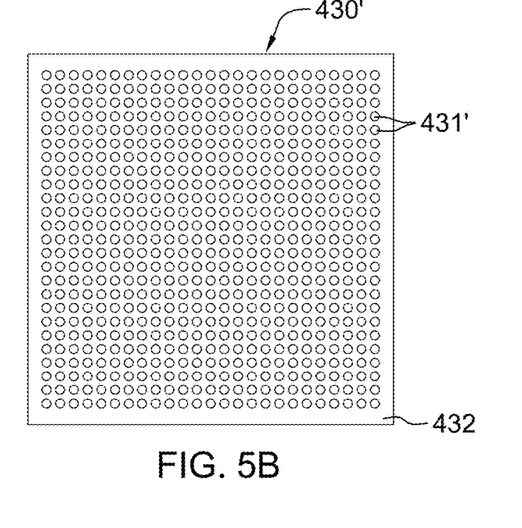
FIG. 5B is a plan view of another embodiment of a screen for a coolant-cooled heat sink, such as the coolant-cooled heat sink of FIGS. 4A-4D, in accordance with one or more aspects of the present invention.
Figure 5C:
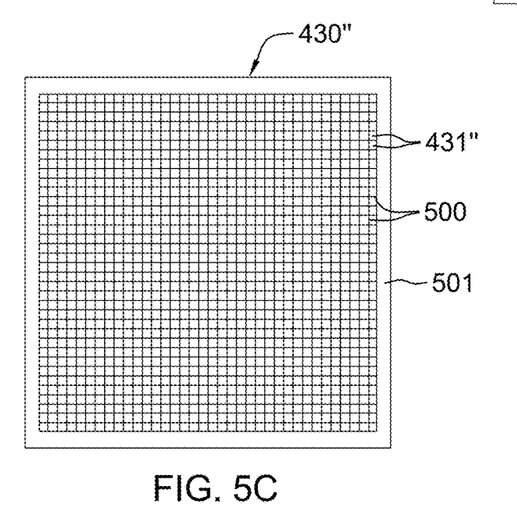
FIG. 5C depicts a further embodiment of a screen for a coolant-cooled heat sink, such as the coolant-cooled heat sink of FIGS. 4A-4D, in accordance with one or more aspects of the present invention.

FIGS. 5A-5C depict exemplary embodiments of an internal screen for a coolant-cooled heat sink, such as described herein. Note that the overall configuration of the screen is dependent on the implementation. For instance, the configuration of the screen can depend on the footprint size and shape of the thermally-conductive fins, as well as whether a single screen or multiple co-planar screens are desired to overlie the thermally-conductive fins. In FIG. 5A, screen 430 of FIGS. 4A-4D is illustrated, with openings 431 formed through a plate 432. In one or more embodiments, plate 432 is a metal plate or sheet of, for instance, copper, nickel, etc., that has undergone a punch process to form openings 431. The thickness of plate 432 can be about the same, or slightly thicker than, the thickness of the thermally-conductive fins, for instance, in the range of 200 μm-500 μm. Further, the size of openings 431 extending through plate 432 (i.e., the transverse cross-sectional width of the openings) can be about the same or smaller than the pitch between the thermally-conductive fins (e.g., 150 μm-300 μm). In the embodiment of FIG. 5A, openings 431 are rectangular-shaped or square-shaped, by way of example only. As another embodiment, screen 430' of FIG. 5B can be formed of a similar plate 432 as screen 430 of FIG. 5A, with the openings 431' being formed as circular-shaped openings, again having a transverse cross-sectional size (i.e., diameter) that is substantially equal to or less than a gap spacing between the underlying thermally-conductive fins within the coolant-cooled heat sink. FIG. 5C depicts a further alternate embodiment, where screen 430" includes a frame 501 with a mesh structure formed by woven metal wires or lines 500 defining openings 431" extending through screen 430". Those skilled in the art will note from the discussion provided herein that other screen configurations are possible, with the screen configuration and material being selected to wick and retain excess joining material during the joining process, including wetting or reacting with melting joining material to wick the joining material in a planar direction and reduce the total surface energy, thereby preventing the joining material from migrating into the gaps between adjacent thermally-conductive fins of the heat sink below the screen.

Figure 6:
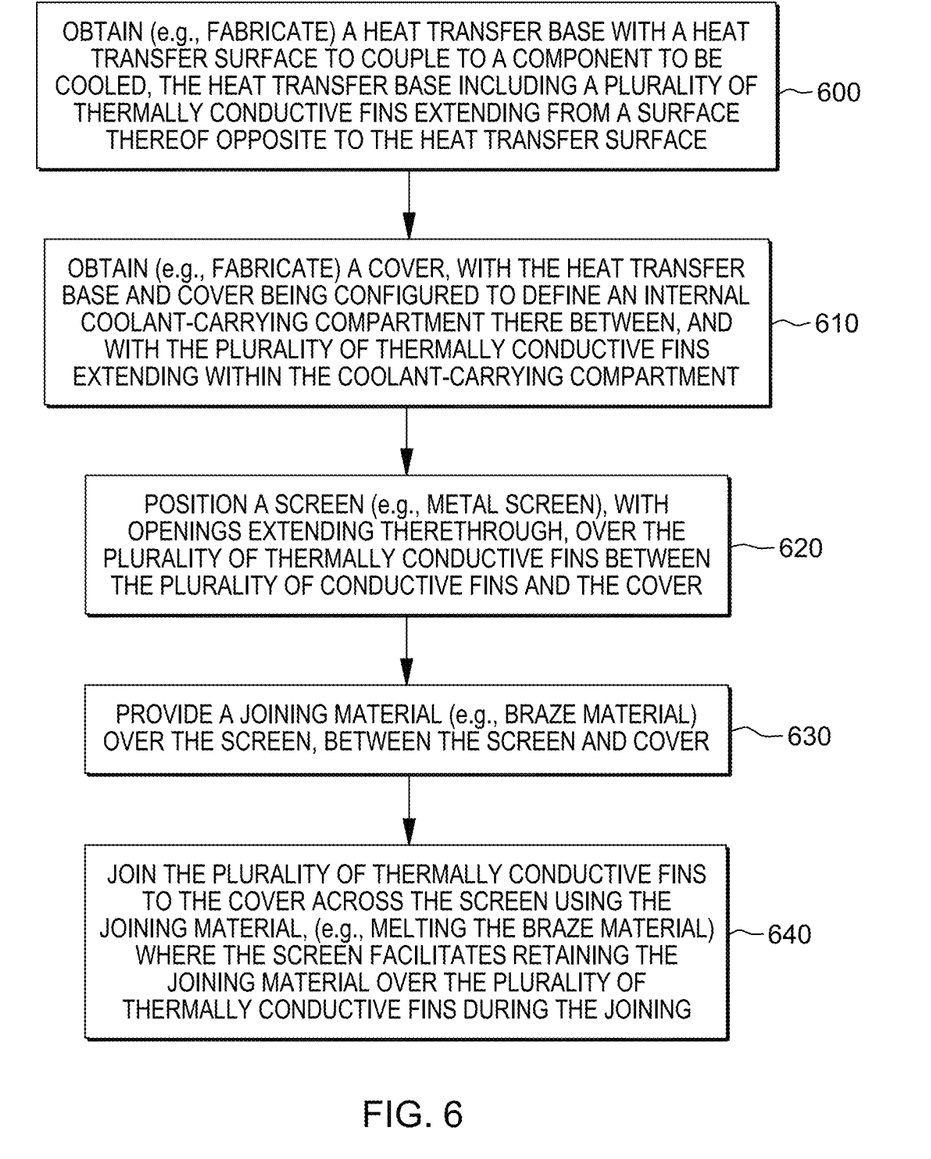
FIG. 6 depicts one embodiment of a process of fabricating a coolant-cooled heat sink, in accordance with one or more aspects of the present invention.

FIG. 6 depicts one embodiment of a process of fabricating a coolant-cooled heat sink, in accordance with one or more aspects of the present invention. As illustrated, a heat transfer base such as described herein is obtained or fabricated 600. The heat transfer base can be a metal structure that includes a heat transfer surface to couple to one or more components to be cooled, such as one or more electronic components to be cooled. Further, a plurality of thermally-conductive fins are provided (e.g., machined) to extend from a surface of the heat transfer base opposite to the heat transfer surface. A cover is also obtained or fabricated 610, with the heat transfer base and cover being configured to define an internal coolant-carrying compartment between the cover and base, and with the plurality of thermally-conductive fins extending into the coolant-carrying compartment.

A screen, such as a metal screen, with openings extending therethrough, is positioned over the plurality of thermally-conductive fins, between the plurality of thermally-conductive fins and the cover 620. A joining material, such as a braze material, is provided over the screen, between the screen and the cover 630. The fabricating process further includes joining the plurality of thermally conductive fins to the cover across the screen using the joining material (for instance, by melting the joining material, such as a braze or solder material) 640. The screen facilitates retaining the joining material over the plurality of thermally-conductive fins during the joining. Advantageously, the openings in the screen are sized to allow the joining material to contact the plurality of thermally-conductive fins, while inhibiting the joining material from migrating into the gaps between adjacent thermally-conductive fins during the joining process. As noted, the openings are sized to create small reservoirs to trap excess joining material during the joining process. Also, the extra surfaces introduced by the screen are designed to wet or react with the joining material, for instance, after the material melts, as part of the joining process. The bonding of the joining material to the screen, and the flow of the material into the openings in the screen, advantageously reduces the total surface energy of the material, inhibiting or preventing the joining material from migrating into the underlying gaps between adjacent thermally-conductive fins. Further, the addition of the screen such as disclosed herein over the thermally-conductive fins, also facilitates increasing mechanical rigidity of the coolant-cooled heat sink by, for instance, dispersing the melted joining material more evenly across the interface between the thermally-conductive fins and the cover. For instance, the screen material can be selected to operate as a wicking element to direct the joining material laterally above the thermally-conductive fins, further mitigating or eliminating fin clogging during the joining process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
providing a coolant-cooled heat sink with a coolant-carrying compartment between a cover and a heat transfer base, the heat transfer base including a heat transfer surface to couple to a component to be cooled, and the heat transfer base including a plurality of thermally-conductive fins extending into the coolant-carrying compartment from a surface of the heat transfer base opposite to the heat transfer surface, the providing comprising:
positioning a screen with openings over the plurality of thermally-conductive fins, between the plurality of thermally-conductive fins and the cover;
providing a joining material over the screen, between the screen and the cover; and
joining the plurality of thermally-conductive fins to the cover across the screen using the joining material, where the screen facilitates retaining the joining material over the plurality of thermally-conductive fins during the joining.

2. The method of claim 1, wherein the openings in the screen are sized to inhibit the joining material from moving into gaps between adjacent thermally-conductive fins of the plurality of thermally-conductive fins during the joining.

3. The method of claim 1, wherein the joining comprises applying heat to melt the joining material, with the melted joining material wetting the screen, and migrating, at least in part, into the openings in the screen.

4. The method of claim 3, wherein the screen is a metal screen, and the joining material is a brazing material.

5. The method of claim 3, wherein the openings in the screen are similarly sized and configured, and a transverse cross-sectional size of the openings is substantially equal to or less than a gap spacing between adjacent thermally-conductive fins of the plurality of thermally-conductive fins.

6. The method of claim 1, wherein the screen comprises a plate with the openings being sized to inhibit the joining material from moving into gaps between adjacent thermally-conductive fins of the plurality of thermally-conductive fins during the joining.

7. The method of claim 1, wherein the screen comprises a mesh structure with the openings being sized to inhibit the joining material from moving into gaps between adjacent thermally-conductive fins of the plurality of thermally-conductive fins during the joining.

8. The method of claim 1, wherein the screen is flat and sized and configured to a footprint of the plurality of thermally-conductive fins extending from the surface of the heat transfer base.

9. An apparatus comprising:
a coolant-cooled heat sink with a coolant-carrying compartment, the coolant-cooled heat sink comprising:
a heat transfer base with a heat transfer surface to couple to a component to be cooled, the heat transfer base including a plurality of thermally-conductive fins extending into the coolant-carrying compartment from a surface of the heat transfer base opposite to the heat transfer surface;
a cover sealed to the heat transfer base, the heat transfer base and cover defining, at least in part, the coolant-carrying compartment therebetween;
a screen with openings, the screen being disposed over the plurality of thermally-conductive fins of the heat transfer base, between the plurality of thermally-conductive fins and the cover; and
a joining material disposed between the screen and cover, and within, at least in part, the openings in the screen, the joining material joining the plurality of thermally-conductive fins to the cover across the screen.

10. The apparatus of claim 9, wherein the openings in the screen are sized to inhibit the joining material when melted from migrating into gaps between adjacent thermally-conductive fins of the plurality of thermally-conductive fins.

11. The apparatus of claim 9, wherein a transverse cross-sectional size of the openings in the screen is substantially equal to or less than a gap spacing between adjacent thermally-conductive fins of the plurality of thermally-conductive fins.

12. The apparatus of claim 9, wherein the screen comprises a plate with the openings extending therethrough, and the joining material resides, at least in part, within the openings in the plate.

13. The apparatus of claim 9, wherein the screen comprises a mesh structure with the openings extending therethrough, and the joining material resides, at least in part, within the openings in the mesh structure.

14. The apparatus of claim 9, wherein the screen is a metal screen, and the joining material is a braze joint.

15. The apparatus of claim 9, wherein the screen is flat and sized and configured to a footprint of the plurality of thermally-conductive fins within the coolant-carrying compartment.

16. The apparatus of claim 9, wherein the cover includes a coolant inlet and a coolant outlet to facilitate flow of coolant through the coolant-carrying compartment in direct contact with the plurality of thermally-conductive fins.

17. An apparatus comprising:
a heat-generating electronic component;
a coolant-cooled heat sink comprising:
a heat transfer base with a heat transfer surface coupled to the heat-generating electronic component, the heat transfer base including a plurality of thermally-conductive fins extending into a coolant-carrying compartment of the coolant-cooled heat sink, from a surface of the heat transfer base opposite to the heat transfer surface;
a cover sealed to the heat transfer base, the heat transfer base and the cover defining, at least in part, the coolant-carrying compartment therebetween;
a screen with openings, the screen being disposed over the plurality of thermally-conductive fins of the heat transfer base, between the plurality of thermally-conductive fins and the cover; and
a joining material disposed between the screen and cover, and within, at least in part, the openings in the screen, the joining material joining the plurality of thermally-conductive fins to the cover across the screen.

18. The apparatus of claim 17, wherein the openings in the screen are sized to inhibit the joining material when melted from migrating into gaps between adjacent thermally-conductive fins of the plurality of thermally-conductive fins.

19. The apparatus of claim 17, wherein a transverse cross-sectional size of the openings in the screen is substantially equal to or less than a gap spacing between adjacent thermally-conductive fins of the plurality of thermally-conductive fins.

20. The apparatus of claim 17, wherein the screen is a metal screen, and the joining material is a braze joint.

* * * * *